Dec. 1, 1964 R. C. INGRAHAM 3,159,775

SEMICONDUCTOR DEVICE AND METHOD OF MANUFACTURE

Filed Nov. 30, 1960

INVENTOR
ROBERT C. INGRAHAM
BY David M. Keay
AGENT

United States Patent Office 3,159,775

Patented Dec. 1, 1964

3,159,775

SEMICONDUCTOR DEVICE AND METHOD OF MANUFACTURE

Robert C. Ingraham, Topsfield, Mass., assignor to Sylvania Electric Products Inc., a corporation of Delaware Filed Nov. 30, 1960, Ser. No. 72,630

1 Claim. (Cl. 317—234)

This invention relates to semiconductor electrical translating devices. More particularly, it is concerned with alloyed junction transistors and with methods of mounting and making electrical connections to their electrically active elements.

One well known type of semiconductor electrical translating device is the alloyed junction transistor. The electrically active elements of this device include a thin chip or die of semiconductor material, such as germanium or silicon of one conductivity type, with projecting opposite conductivity type imparting electrodes alloyed into the die from two opposite surfaces to form the emitter and collector. A base connection or tab which provides an ohmic base contact to the bulk of the semiconductor die may also be considered as part of the active elements. The active elements of devices of this type are usually enclosed in an envelope or housing to protect them from physical damage and from contamination by the atmosphere. The envelope has leads sealed therethrough which are connected to the active elements so as to provide separate electrical connections from each of the electrodes and the base tab to the exterior of the envelope. Commonly the envelope is in the form of a two-part housing which includes a stem or base section through which the leads are sealed so as to be insulated from each other and a cap or cover section. When this form of envelope is employed, the active elements are mounted on the base section, electrical connections are made from the electrodes and base tab to the leads and then the cover is sealed to the base section so as to enclose the active elements.

The active elements may be mounted on the base section by attachment of the base tab to the metal casing or body of the base section or to a base lead. An electrical connection is made from the emitter electrode to one of the leads by soldering a short length of fine wire to the lead and to the electrode. A similar connection is also made from the collector electrode to another lead. Typically, these connections are made individually for each device by an operator employing tweezers, scissors, solder, and a small soldering iron, while observing the operation through a microscope. The time and precision required for an operator to position the end of a piece of wire against an electrode and make a properly soldered connection may be more readily appreciated when it is realized that the electrodes commonly are of the order of 10 to 20 mils in diameter and the wire is about 3 mils in diameter.

It is an object of the present invention, therefore, to provide an improved method of making electrical connections to the active elements of an alloyed junction semiconductor device.

It is a more specific object of the invention to provide an improved method of mounting the active elements of an alloyed junction semiconductor device on the base section of an envelope and making electrical connections between the active elements and the leads of the base section.

It is also an object of the invention to provide an improved alloyed junction semiconductor device having supporting structure and electrical connections for the electrically active elements which permit simplified and efficient assembly of the active elements therewith.

Briefly, in accordance with the objects of the invention a plate or wafer of insulating material having an aperture for receiving the active elements and having separate metallized areas on one surface for providing electrical contacts to the active elements is employed. The width of the aperture in the plate is slightly greater than the thickness of the active elements exclusive of the electrodes and is slightly less than the thickness of the active elements including the electrodes. The metallized areas extend to adjacent the edges of the aperture. The plate is placed on the base section of an envelope with each metallized area adjacent a lead. The active elements are then placed in the aperture in the plate of insulating material with the electrodes bearing against the edges of the aperture in contact with the metallized areas thereby supporting the active elements in position. Solder material is provided in the regions where the leads are adjacent the metallized areas. This arrangement of parts is then heated causing the solder and electrode material to melt, and subsequently the parts are cooled. Mechanical and electrical connections are thus obtained between each metallized area and its adjacent lead and between each metallized area and the electrode contacting it.

Additional objects, features, and advantages of the present invention will be apparent from the following detailed discussion and the accompanying drawings wherein.

Figures 1, 2, 3, 4:
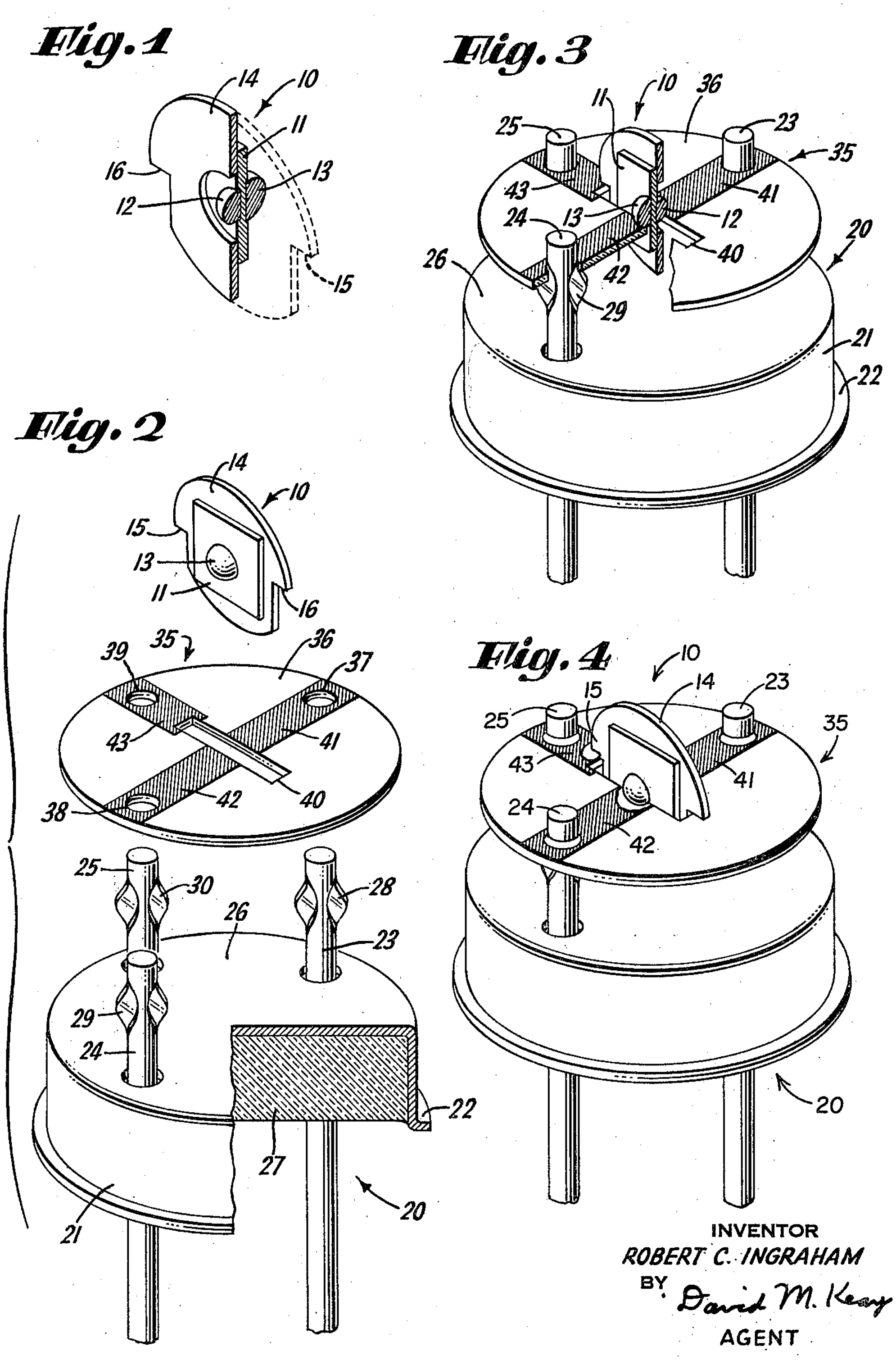
FIG. 1 is a perspective view in cross-section of the electrically active elements of an alloyed junction transistor employed in practicing the present invention.
FIG. 2 is an exploded view in perspective of the active elements of FIG. 1, a base section of a two-part envelope or housing onto which the active elements are to be mounted, and a ceramic disc or plate for mounting the active elements on the base section and having metallized areas for providing electrical connections between the active elements and the leads of the base section.

FIG. 3 is a perspective view of the parts shown in FIG. 2 arranged with the ceramic disc supported on the base section and with the active elements supported on the ceramic disc; and FIG. 4 is a perspective view of the arrangement of parts shown in FIG. 3 subsequent to the formation of mechanical and electrical connections between the metallized areas on the ceramic disc and the active elements, and between the metallized areas and the leads of the base section.

Because of the extremely small size of various portions of the device, some of the dimensions of many of the parts shown in the drawings have been exaggerated with respect to other dimensions. It is believed that greater clarity of presentation is thereby obtained despite consequent distortion of parts in relation to their actual physical appearance.

The active elements 10 of an alloyed junction transistor as shown in FIGS. 1 and 2 include a chip or die 11 of a semiconductor material having an emitter electrode 12 and a collector electrode 13 alloyed concentrically on opposite major surfaces. The electrodes are formed from pellets of a material which imparts to the semiconductor material the conductivity type opposite to the conductivity type of the die. The pellets are alloyed into the die in the usual well known manner to form the emitter and the collector junctions in the die and provide the projecting emitter and collector electrodes. A metal base tab 14 which is coated with solder on both major surfaces is soldered to the die to provide ohmic contact to the bulk or base regions of the transistor. The base tab is in the form of a generally circular washer encircling the emitter electrode. Sections of the washer are removed to reduce the width of a portion of the washer and to provide two projections 15 and 16. The extremities of the projections are approximately on a diameter of the circular portion of the base tab.

The stem or base section 20 of the envelope, shown in FIG. 2 onto which the active elements are to be mounted is a type of base section which is commonly employed together with a cover section to form enclosures for semiconductor devices. This base section includes a generally cylindrical casing 21 having at its periphery an outwardly turned rim 22 adapted for sealing to the cover section of the envelope (not shown). Three cylindrical metal leads 23, 24, and 25 pass through openings in the casing. The leads extend parallel to each other on both sides of the planar upper surface 26 of the base section to which they are perpendicular, and they are arranged in a circle concentric with the cylindrical casing. The emitter and collector leads 23 and 24 are located on a diameter of the circle and the base lead 25 is located at the same distance as the other leads from the center of the circle and equidistant from each of the other two leads. The leads are hermetically sealed in position by a layer or filler of glass 27 which forms a hermetic seal with the metal casing 21. Each of the leads 23, 24, and 25 is deformed as by swaging a portion of produce flattened protrusions or ears 28, 29, and 30 each at the same distance from the base surface 26. The portions of the leads above the ears are coated with a solder metal such as, for example, tin.

According to the present invention, the active elements 10 are mounted on the base section 20 and are appropriately connected to the leads by the use of a mounting fixture 35 as shown in FIG. 2. The fixture includes a flat, thin plate or disc 36 of a ceramic or other suitable electrically insulating material. Three holes or openings 37, 38, and 39 which extend through the disc from the upper planar surface of the disc are spaced in the same pattern as the three leads of the base section. Each of the holes is larger in diameter than the diameter of a lead wire, but smaller than the long dimension through the ears on a lead. A rectangular slot or aperture 40 also extends through the disc from the upper surface. This aperture lies generally perpendicular to a line between the two diametrically opposed holes 37 and 38. The length of the aperture is slightly less than the width of the base tab 14 of the active elements across the projections 15 and 16 and is slightly greater than the width of the base tab in the region of reduced width. The width of the aperture is greater than the combined thickness of the semiconductor die 11 and the base tab 14 and is less than the thickness of the die and the two projecting electrodes. A first area 41 on the surface of the disc is metallized to provide a continuous conductive member from adjacent the first hole 37 to adjacent the central portion of a long edge of the aperture. A second metallized area or stripe 42 on the surface provides a continuous conductive member from adjacent the second hole 38 to adjacent the central portion of the other long edge of the aperture. A third metallized area 43 on the surface extends from adjacent the third hole 39 to the region adjacent a short edge of the aperture.

In employing the mounting fixture 35 to mount the active elements of an alloyed junction transistor 10 to a base section 20, the fixture is first placed on the base section as shown in FIG. 3. The disc is oriented with the metallized areas up, and the three leads 23, 24, and 25 are received in the three holes 37, 38, and 39, respectively. The ears 28, 29, and 30 on the leads act as supports for the disc and hold it parallel to the surface 26 of the base and perpendicular to the leads at a predetermined height above the surface. The active elements 10 are then placed in the aperture 40 in the disc with the base tab projections above the disc. The active elements extend above and below the disc, and because the aperture will not receive the projecting emitter and collector electrodes 12 and 13, the active elements are supported by the electrodes which bear on the surface of the disc at the edges of the aperture. Because of the length of the aperture and width of the metallized areas in relation to the dimensions of the active elements, the emitter and collector electrodes 12 and 13 contact the first and second metallized areas 41 and 42, respectively, and the base tab 14 is adjacent the third metallized area 43. The configuration of the parts is also such as to insure that no portion of the base tab 14 is sufficiently close to the first metallized area 41 that subsequent shorting between the base tab and the first area could occur. In order to obtain the proper position of the active elements when they are placed in the mounting fixture, it is only necessary that the emitter electrode be oriented toward the emitter lead and the collector electrode be oriented toward the collector lead. Proper alignment of the parts is otherwise automatically obtained because of their configuration.

After the disc and active elements have been placed on the base section, the resulting arrangement of parts is heated as by being passed through a furnace with a reducing atmosphere to cause the electrode material and solder metal to melt. The material of each electrode makes intimate contact with its associated adjacent metallized area and the molten solder forms contacts between each lead and its adjacent metallized area and between the base tab and the third metallized area as shown in FIG. 4. The surface tension of the molten material of each electrode tends to hold the electrode in its spherical form, and thus the electrodes, though molten, continue to support the active elements on the fixture. However, the electrodes are deformed to some extent by the weight of the active elements which they sustain, and the resulting displacement of the active elements helps insure contact between the projection 15 of the base tab and the third metallized area 43. Distortion of the electrodes has no effect on the electrical characteristics of the active elements because the junction regions are not affected in any way. Upon subsequent cooling of the arrangement of parts and consequent solidifying of the electrode material and solder metal, electrical and mechanical bonds are formed between the electrodes and base tab of the active elements and their associated metallized areas on the ceramic disc and between each of the metallized areas and its associated lead. The assembled unit as shown in FIG. 4 is then ready for final processing steps such as etching, cleaning, baking, and sealing of a suitable cap or cover to the base section of the envelope.

In the fabrication of a typical device according to the invention, a standard cylindrical envelope having a base section 20 with 17 mil diameter leads arranged in a circle 0.2 inch in diameter is employed. A portion of each of the leads is swaged to provide the protrusions or ears 28, 29, and 30 at a distance of about 75 mils from the surface 26 of the base section. The metallic portions of the base section are gold-plated, and the portions of the leads above the ears are hot tin dipped to provide a layer of solder metal on each lead. The electrically active transistor elements include a die 11 of P-type germanium 75 mils square and 1.6 mils thick. Centered on the opposite major surface of the die are prjecting emitter and collector electrodes 12 and 13 of lead-arsenic and lead-antimony, respectively, which have been alloyed to the die according to well known techniques. The portions of the electrodes projecting beyond the surfaces of the die are generally hemispherical in shape, the collector electrode having a diameter of about 19 mils and height of about 8 mils, the emitter electrode having a diameter of about 16 mils and a height of about 6 mils. Soldered to the die is a nickel washer or base tab 14 which has been coated with tin. The major diameter of the base tab, which is approximately the same as its width across the projections 15 and 16, is .112 inch and the tab is 90 mils wide in the region of reduced width below the projections. The tab including the layers of tin is 4 mils thick. The inside diameter or opening in the base tab is approximately 36 mils and the emitter electrode is centered within the opening.

The mounting fixture 35 includes a disc of non-porous alumina .265 inch in diameter and 20 mils thick. Openings in the disc for the leads of the base section are each 25 mils in diameter and the aperture 40 for receiving the active elements is 100 mils by 8 mils. The metallized areas are obtained by the well known technique of depositing a molybdenum-manganese mixture through a silk screen pattern and subsequently firing the deposited metal. A gold plating is then placed over the fired metal. The first and second metallized areas 41 and 42 are each 20 mils wide in the regions adjacent the edges of the aperture. This width together with the length of the aperture and the dimensions of the active elements insures that contact is made between the electrodes and the metallized areas and also insures that the base tab cannot short out to the first metallized area.

After the mounting fixture is placed on the base section and the active elements are placed in the aperture 40 of the fixture, the arrangement of parts is placed in a furnace having a hydrogen atmosphere. It is heated to a temperature of about 395° C. for a period of about 3 minutes. This treatment causes the electrode material to melt and wet the metallized areas, and the solder material to melt and wet the leads, metallized areas, and the base tab. Upon cooling of the parts, electrical and mechanical bonds are obtained between the active elements and the metallized areas and the leads of the base section. The assembled unit is subsequently etched and cleaned, and a cover is welded to the base section at the rim, in accordance with usual processing techniques, to form the completed device.

Although the invention has been described and explained in terms of a specific embodiment, various modifications are obviously possible without departing from the spirit and scope of the invention. For example, solder material may be provided in the regions of the metalized areas and the leads by placing on the metallized areas preformed solder rings which encircle the leads rather than by coating the leads with solder prior to placing the ceramic disc on the base section. The metallized areas on the ceramic disc may be coated with a solder metal in order to obtain or facilitate obtaining the electrical and mechanical connections. In addition, it is contemplated that alternate configurations of the base tab may be employed in order to provide contact between the base tab and its associated metallized area when the active elements are placed in the fixture.

What is claimed is:

A semiconductor device including a thin, flat body of semiconductor material having electrodes of conductivity type imparting material alloyed to opposite major surfaces thereof and projecting therefrom and a metal tab bonded to said body, a base member having three leads lying parallel to and insulated from each other, a thin, flat, plate of insulating material lying perpendicular to said leads and having three openings with said leads extending therethrough, means on each of said leads for holding said plate out of contact with the remainder of the base member, an aperture in said plate having dimensions in width greater than the thickness of the body of semiconductor material and the metal tab and less than the thickness of the body and projecting electrodes, said body extending through said aperture with said electrodes bearing against one surface of said plate, a first metallized area on the surface of the plate extending from the region of one of said electrodes to a first one of said openings in the plate, a second metallized area on the surface of the plate extending from the region of the other of said electrodes to a second one of said openings in the plate, and a third metallized area on the surface of the plate extending from the edge of said aperture adjacent said metal tab to the third one of said openings, said electrodes being fused to their respective metallized areas, and solder connections between each of said leads and their respective metallized areas and between the metal tab and the third metallized area.

References Cited in the file of this patent

UNITED STATES PATENTS

| | | |
|---|---|---|
| 2,634,322 | Law | Apr. 7, 1953 |
| 2,705,768 | Kleimack et al. | Apr. 5, 1955 |
| 2,813,326 | Liebowitz | Nov. 19, 1957 |
| 2,836,878 | Shepard | June 3, 1958 |
| 2,906,930 | Raithel | Sept. 29, 1959 |
| 2,917,684 | Becherer | Dec. 15, 1959 |
| 3,021,461 | Oakes et al. | Feb. 13, 1962 |
| 3,080,510 | Breuer | Mar. 5, 1963 |